United States Patent
Wu et al.

(10) Patent No.: US 12,528,198 B2
(45) Date of Patent: Jan. 20, 2026

(54) ROBOT MAGAZINE AND TRAY LOAD AND UNLOAD SYSTEM

(71) Applicant: Taiwan Semiconductor Manufacturing Company, Ltd., Hsinchu (TW)

(72) Inventors: Cheng-Lung Wu, Miaoli County (TW); Chih-Hung Huang, Hsinchu County (TW); Yang-Ann Chu, Hsinchu (TW); Jiun-Rong Pai, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1034 days.

(21) Appl. No.: 17/582,131

(22) Filed: Jan. 24, 2022

(65) Prior Publication Data

US 2023/0012325 A1 Jan. 12, 2023

Related U.S. Application Data

(60) Provisional application No. 63/219,902, filed on Jul. 9, 2021.

(51) Int. Cl.
 *B25J 11/00* (2006.01)
 *B25J 15/00* (2006.01)

(52) U.S. Cl.
 CPC ....... *B25J 11/0095* (2013.01); *B25J 15/0014* (2013.01)

(58) Field of Classification Search
 CPC ............ B25J 11/0095; B25J 15/0014; H01L 21/67313; H01L 21/67326;
 (Continued)

(56) References Cited

U.S. PATENT DOCUMENTS 4,723,799 A * 2/1988 Wollmann ........ H01L 21/68707
 294/68.1
4,840,530 A * 6/1989 Nguyen ............ H01L 21/67326
 414/940

(Continued)

FOREIGN PATENT DOCUMENTS

CN 106601648 A 4/2017
CN 112736003 A 4/2021
(Continued)

OTHER PUBLICATIONS

Chinese Office Action of Application No. 202210815390.2, dated Jul. 30, 2025.

*Primary Examiner* — Emmanuel M Marcelo
(74) *Attorney, Agent, or Firm* — Lippes Mathias LLP

(57) ABSTRACT

A wafer magazine is disposed on a load port of an oven chamber. The wafer magazine contains one or more wafer boats with semiconductor wafers. The wafer boats are supported in the wafer magazine by wall slots of the wafer magazine. Using a push bar, the wafer boats are transferred out of the wafer magazine and into a wafer magazine jig also disposed on the load port. The transferred one or more wafer boats are supported in the wafer magazine jig by wall slots of the wafer magazine jig. During transfer, the wafer boats are supported across a gap between the wafer magazine and the wafer magazine jig by wall slots of a boat bridge interposed between the wafer magazine and the wafer magazine jig. After the transfer and using a robot, the wafer boats in the wafer magazine jig are moved into the oven chamber.

20 Claims, 8 Drawing Sheets

(58) Field of Classification Search
CPC ......... H01L 21/67754; H01L 21/68707; H01L 21/67766; H01L 21/67763; H01L 21/67742
See application file for complete search history.

(56) References Cited

U.S. PATENT DOCUMENTS

| | | | | |
|---|---|---|---|---|
| 5,162,047 | A * | 11/1992 | Wada | H01L 21/67778 414/416.03 |
| 6,533,531 | B1 * | 3/2003 | Nguyen | H01L 21/68707 414/416.03 |
| 2003/0164179 | A1 * | 9/2003 | Kamikawa | H01L 21/67781 134/25.4 |
| 2003/0202871 | A1 * | 10/2003 | Thompson | H01L 21/67781 414/539 |
| 2009/0142176 | A1 * | 6/2009 | Choi | H01L 21/6732 414/806 |
| 2010/0272544 | A1 | 10/2010 | Rivollier et al. | |
| 2016/0027677 | A1 * | 1/2016 | Stefaner | H01L 21/02233 118/728 |
| 2019/0067066 | A1 * | 2/2019 | Aiso | H01L 21/67748 |
| 2022/0172966 | A1 * | 6/2022 | Choi | B08B 7/0021 |

FOREIGN PATENT DOCUMENTS

| | | | | |
|---|---|---|---|---|
| JP | S63106140 A | | 5/1988 | |
| JP | 1989230246 A | | 9/1989 | |
| JP | 2014110294 A | | 6/2014 | |
| JP | 2014170841 A | | 9/2014 | |
| KR | 20020002866 A | | 1/2002 | |
| KR | 2008061600 A | * | 7/2008 | ....... H01L 21/67313 |
| WO | WO-2010092930 A1 | * | 8/2010 | ....... H01L 21/67126 |

* cited by examiner

ROBOT MAGAZINE AND TRAY LOAD AND UNLOAD SYSTEM

This application claims the benefit of U.S. provisional application Ser. No. 63/219,902 filed Jul. 9, 2021 and titled "Robot Magazine Load and Unload System" which is incorporated herein by reference in its entirety.

BACKGROUND

The following relates to semiconductor fabrication arts, semiconductor wafer handling arts, semiconductor processing furnace arts, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
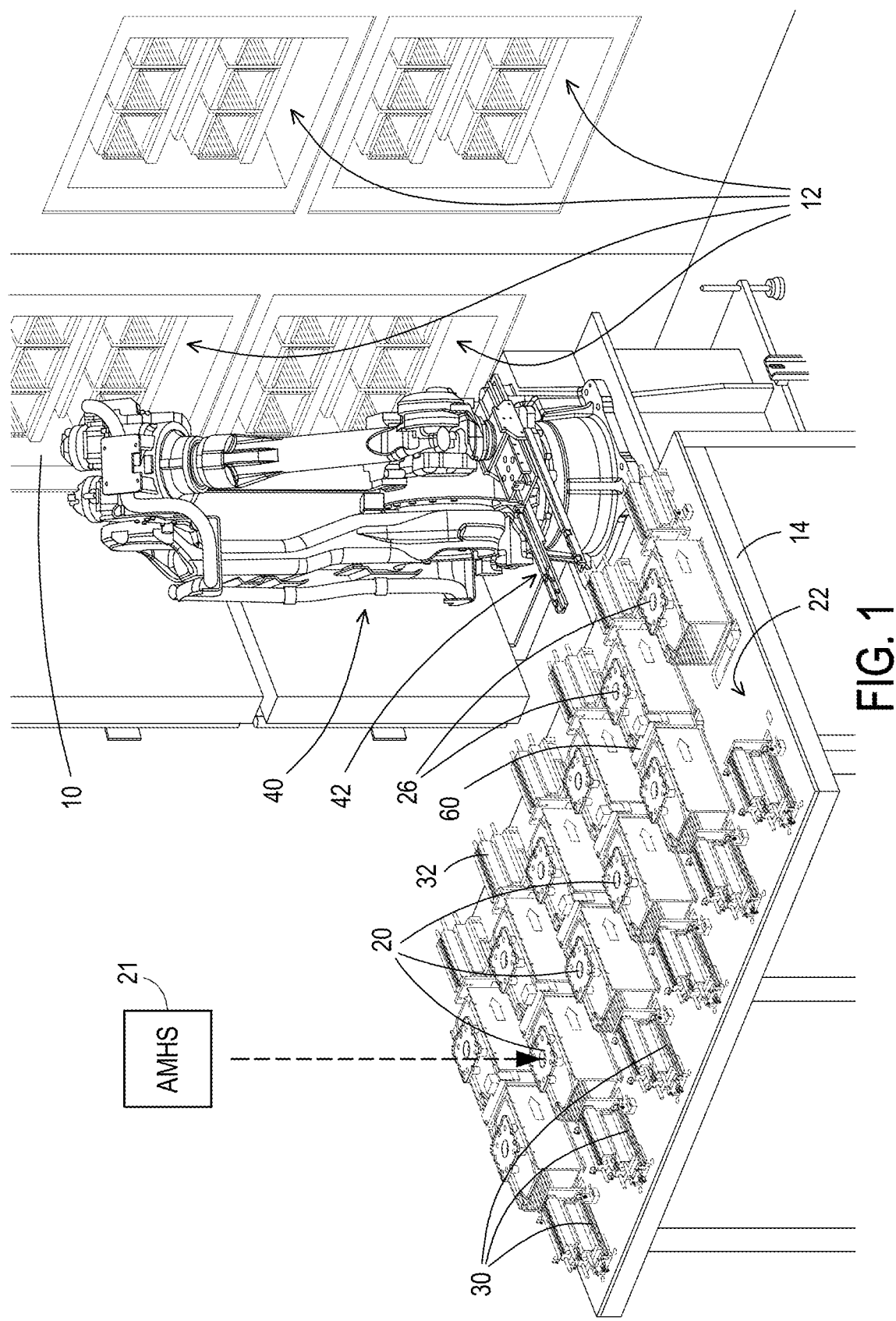
FIG. 1 and FIG. 2 diagrammatically illustrate different perspective views of a load port for transferring wafers to and from an oven chamber.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a semiconductor fabrication facility, batches of semiconductor wafers are moved through the fabrication facility using an automated transfer system such as an automated material handling system (AMHS), which may for example include overhead transport (OHT) trolleys to move semiconductor wafer batches between different processing tools along a predetermined workflow. The various processing tools may include, by way of non-limiting illustrative example, photolithography systems, deposition systems, etching systems, and so forth.

Some processing tools include an oven chamber for performing thermal processing of semiconductor wafers, such as for annealing, performing thermal oxidation in an ambient including oxygen and/or an oxygen-containing species, performing post-exposure bake (PEB) as part of a photolithography process, dopant diffusion, or so forth. Processes performed at elevated temperatures can implicate increased potential for semiconductor wafer contamination due to outgassing from heated materials. Furthermore, the high temperature can present a safety hazard for fabrication facility personnel, for example burn hazard or explosion hazard (when the thermal processing employs a flammable ambient).

To address these concerns while maintaining high wafer throughput, wafer handling for loading/unloading of semiconductor wafer batches into/out of oven chambers is automated using dedicated wafer transfer components. Notably, the semiconductor wafers are placed onto wafer boats made of a material such as quartz, silicon carbide, or the like that can withstand the elevated temperature inside the oven chamber without unacceptable outgassing. A multi-axis robot may be used to transfer the wafers into/out of the oven chamber, enhancing wafer throughput efficiency, reducing likelihood of wafer contamination, and reducing burn hazard for workers.

While such approaches are beneficial, suitable wafer handling during oven chamber loading/unloading remains challenging, especially as semiconductor wafer sizes continue to increase. For example, heating and cooling of the semiconductor wafers and/or the supporting wafer boats can produce warping of the wafer and/or the wafer boat that can interfere with the automated wafer handling.

Disclosed herein are improved wafer transfer methods for transferring wafers to an oven chamber, and improved wafer loading systems for loading wafer boats stored in a wafer magazine to an oven chamber.

Notably, in embodiments disclosed herein, wafers are transported to a load port of the oven in a wafer magazine, disposed on wafer boats. In embodiments disclosed herein, the wafer boats are planar and oriented horizontally. The load port includes a mechanism for transferring the wafer boats from the wafer magazine to a wafer magazine jig that can be placed into the oven. A gap is present between the wafer magazine and the wafer magazine jig during the transfer of the wafer boats. The gap relaxes the tolerance in the precision with which the wafer magazine and wafer magazine jig are positioned on the load port; however, the gap can introduce problems, since sag or warping can result in unreliable transfer of the wafer boats between the wafer magazine and the wafer magazine jig. As disclosed herein, a boat bridge is interposed between the wafer magazine and the wafer magazine jig during the transfer of the wafer boats. The boat bridge provides support for the wafer boats in the gap. Additionally, wall slots of the boat bridge that support the wafer boats in the gap can have flared ends that further guide the transfer of the wafer boats.

Figure 2:
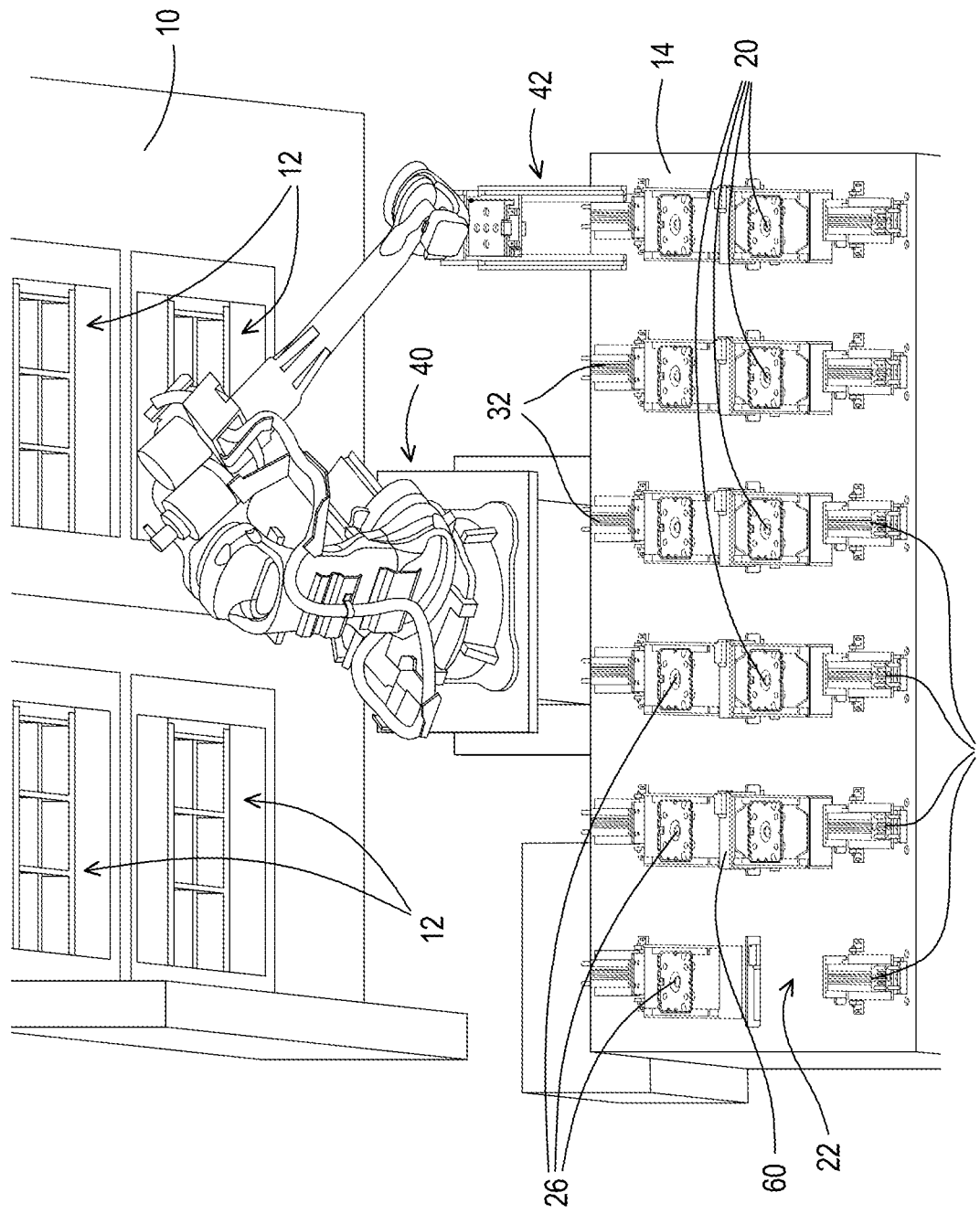

With reference to FIGS. 1 and 2, a furnace or oven 10 includes one or more furnace or oven chambers 12, along with a corresponding load port 14. The terms "furnace" and "oven" are used interchangeably herein, and for brevity "oven" and "oven chamber" is typically used. The oven 10 is used for performing thermal processing of semiconductor wafers. The thermal processing may include annealing, thermal oxidation (e.g. to form a thermal oxide on a semiconductor wafer or layer), post-exposure bake (PEB) as part of a photolithography process, thermally driven dopant diffusion, deposition in conjunction with an ambient containing molecules that bond to the surface of a semiconductor wafer or layer at the temperature established by the oven 10, or so forth. The oven 10 controls the temperature in the oven chamber 12 to be a suitable temperature for the specific thermal processing being performed, e.g. in a range of 700° C. to 1300° C. for some thermal oxidation processes performed to oxidize silicon, 800° C. to 1500° C. for some dopant diffusion processes, or higher, 50° C. to 150° C. for some PEB processes, and/or so forth. These are merely nonlimiting illustrative examples. Moreover, the oven 10 may optionally include a programmable electronic controller that executes a thermal cycle recipe. By way of nonlimiting illustration, the thermal cycle may start at a low temperature during wafer loading, ramp up in temperature at a programmed ramp rate (e.g. specified in degrees/minute) to a dwell temperature, hold at the dwell temperature for a fixed time interval, and then ramp back down at a programmed ramp-down rate to a lower unloading temperature. Although not shown in in FIGS. 1 and 2, the oven 10 may optionally include piping for supplying a controlled ambient inside the oven chamber 12 during the thermal processing, such as an oxygen atmosphere, a wet oxygen atmosphere (e.g. by flowing oxygen through a bubbler), a forming gas atmosphere (e.g. a mixture of hydrogen and nitrogen), an atmosphere containing a dopant precursor for a dopant diffusion process, or so forth. Where a controlled atmosphere is provided, the programmable electronic controller (if provided) may execute a flow cycle recipe concurrently with the thermal cycle recipe, so that for example the "active" gas (e.g. oxygen gas in an oxidation process, dopant precursor-bearing gas in the case of a dopant diffusion process, or so forth) is present only during the dwell time of the thermal cycle.

On the other hand, in some embodiments the oven 10 may include little or no complex electronics. For example, the oven 10 may include a single temperature setpoint control for setting the temperature in the oven chamber 12 at a fixed constant temperature, and optional gas inlet and exhaust or outlet for providing the ambient.

Semiconductor wafers disposed on wafer boats are delivered to the load port 14 individually or (more commonly) as a batch, stored in a wafer magazine 20. The wafer magazine 20 is delivered to the load port 14 by an automated material handling system (AMHS) 21 diagrammatically indicated only in FIG. 1 or some other robotic delivery system. For example, the AMHS 21 may comprise an overhead transport (OHT) system comprising a multibranched overhead railway system with a branch leading to the load port 14, carriers or pods running along the railway system within which are loaded wafer magazines, and robotics for automatically transferring wafer magazines from carriers or pods to load ports including the load port 14 of the illustrative oven 10. Although not indicated in FIG. 1, after thermal processing of the wafers contained in the delivered wafer magazine 20 using the oven 10, the AMHS 21 suitably retrieves the wafer magazine 20 and may then transport it to a next process tool of the fabrication facility in accordance with the designed integrated circuit (IC) manufacturing workflow. While AMHS systems are common in large semiconductor fabrication facilities, in a contemplated alternative manual approach the wafer magazine may be delivered manually, e.g. carried by a fabrication facility worker to the load port 14.

Figure 3:
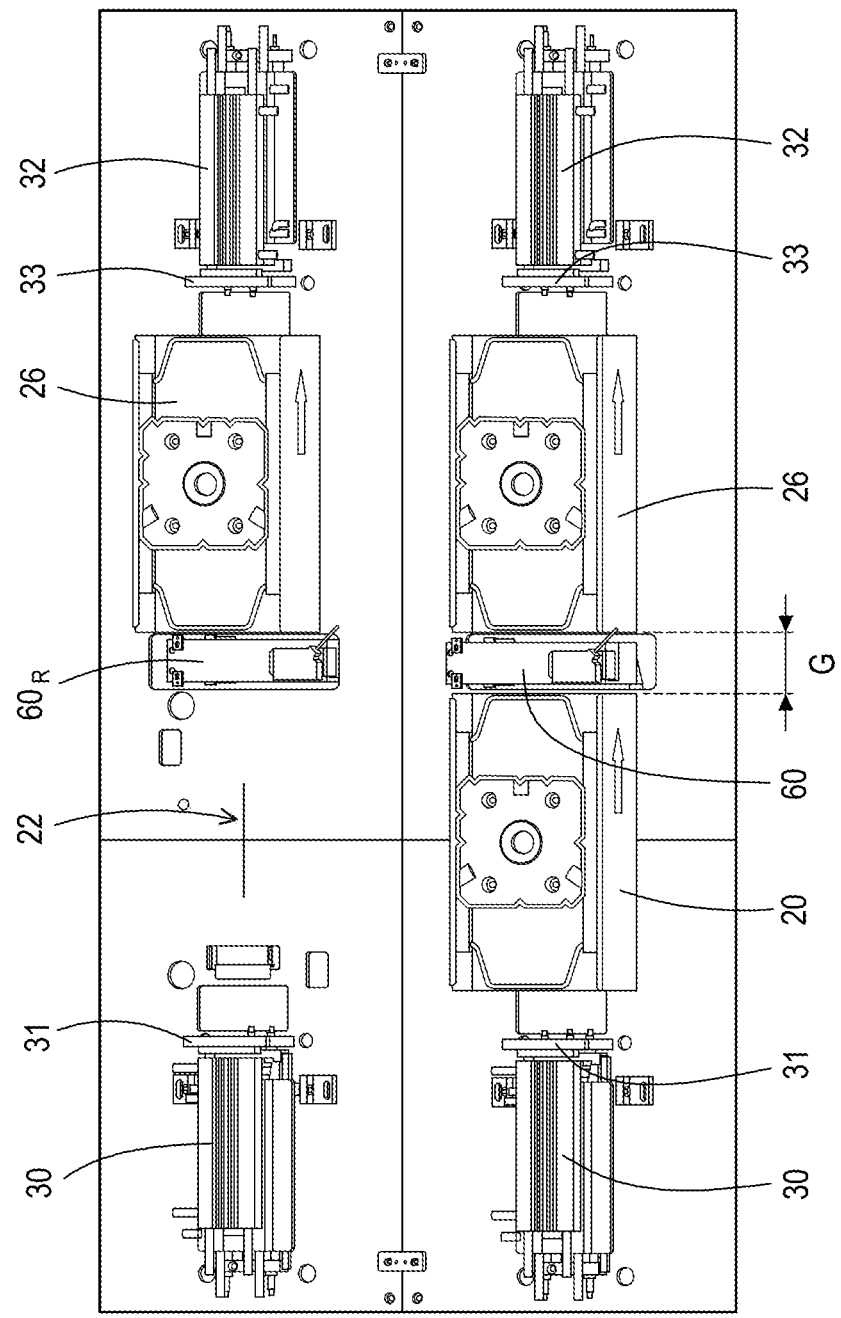
FIG. 3 diagrammatically illustrates an enlarged view of a portion of the load port of FIG. 1 and FIG. 2 including two wafer transfer subassemblies, one of which has a wafer magazine seated in its wafer magazine seat and the other of which does not.

With continuing reference to FIGS. 1 and 2 and with further reference to FIG. 3, the load port 14 includes a tabletop with one or more wafer transfer subassemblies. Two such wafer transfer subassemblies are shown in enlarged view in FIG. 3. Each wafer transfer subassembly includes a wafer magazine seat 22 configured to seat a wafer magazine 20 delivered by the AMHS 21, a wafer magazine jig seat configured to seat a wafer magazine jig 26, and a bidirectional push bar including a first push bar 30 arranged to push wafer boats (with semiconductor wafers disposed thereon) out of the wafer magazine 20 and into the wafer magazine jig 26, and a second push bar 32 arranged to push semiconductor wafers out of the wafer magazine jig 26 and into the wafer magazine 20. Note that FIGS. 1-3 each have one wafer transfer subassembly in which a wafer magazine is not seated, so that the wafer magazine seat 22 is revealed for that wafer transfer subassembly. All wafer transfer subassemblies in FIGS. 1-3 have seated wafer magazine jigs 26, so that an example of the wafer magazine jig seat is not shown, but is understood to be underneath and providing a seat for the illustrated seated wafer magazine jigs 26. In general, the wafer magazine seat 22 includes features that mate with corresponding features of the wafer magazine 20 to prevent the seated wafer magazine 20 from sliding or otherwise moving across the tabletop. For example, the wafer magazine seat 22 may include upwardly extending pins that fit into openings on the bottom of the wafer magazine 20, or vice versa. The wafer magazine jig seat similarly includes features that mate with corresponding features of the wafer magazine jig 26 to prevent the seated wafer magazine jig 26 from sliding or otherwise moving across the tabletop.

Thus, the AMHS 21 delivers a wafer magazine 20 to the load port 14 and seats it in the wafer magazine seat 22, across from a corresponding seated wafer magazine jig 26. The first push bar 30 is motorized and includes an engagement surface 31 (labeled only in FIG. 3) that moves toward and into the wafer magazine 20 (e.g., to the right in the perspective view of FIG. 3) to engage and push wafer boats (with semiconductor wafers) contained in the wafer magazine 20 out of the end of the wafer magazine 20 facing the seated wafer magazine jig 26 of the wafer transfer subassembly, and continues to push the wafer boats until the wafer boats are pushed into the seated wafer magazine jig 26. The first push bar 30 then retracts. (Note, FIGS. 1-3 show all push bars in their respective fully retracted positions).

It is noted that while this process can be used to transfer as few as a single wafer boat carrying a single semiconductor wafer, more typically the wafer magazine 20 carries a plurality of wafer boats with a corresponding plurality of semiconductor wafers to achieve high wafer throughput, e.g.

five, ten, fifteen, twenty, or more wafer boats as some non-limiting illustrative examples. To handle a plurality of wafer boats, the engagement surface 31 of the first push bar 30 suitably has an extended contact area sufficient to engage and push all the wafer boats in the wafer magazine 20 to transfer them from the wafer magazine 20 to the wafer magazine jig 26. For simplicity, a plurality of wafer boats carrying a plurality of semiconductor wafers are referred to herein as an example. Moreover, as it is generally not useful to place a wafer boat that does not carry a semiconductor wafer into the oven 10 (since the goal is to perform thermal processing of the semiconductor wafers, not the wafer boats), it is sometimes not stated herein for brevity that the wafer boats generally carry semiconductor wafers.

With particular reference back to FIGS. 1 and 2, after the wafer boats have been transferred from the wafer magazine 20 into the wafer magazine jig 26 using the first push bar 30 as just described, a multi-axis robot 40 is used to automatically move the wafer boats in the wafer magazine jig 26 into the oven chamber 12. The illustrative multi-axis robot 40 is a six-axis robot, however, otherwise-jointed robots can be employed as appropriate to provide requisite articulation flexibility for performing the transfer. The robot 40 includes a gripping assembly 42 that is shaped and sized to engage and lift the wafer magazine jig 26 off the load port 14 and transport it to the oven chamber 12. The gripping assembly 42 may be a passive assembly, e.g. having a slot that engages a lip or the like of the wafer magazine jig 26; or the gripping assembly 42 may be an active assembly with motorized jaws that close onto the wafer magazine jig 26 to grasp it. In some embodiments, the multi-axis robot 40 places the entire assembly (that is, the wafer boats contained in the wafer magazine jig 26) into the oven chamber 12. Alternatively, the gripping assembly 42 may include a push bar (e.g., similar to the first and second push bars 30, 32) to push the wafer boats contained in the wafer magazine jig 26 into receiving slots in the oven chamber 12. In the illustrative embodiments it is assumed that the robot 40 places the entire assembly, including the wafer magazine jig 26, into the oven chamber 12.

After the wafer boats with the carried semiconductor wafers are placed into the oven chamber 12, the desired thermal processing of the semiconductor wafers is performed using the oven chamber 12. In some embodiments, the oven chamber 12 is held at a fixed constant temperature and the thermal processing is performed for the time interval over which the semiconductor wafers remain in the oven chamber 12. In other embodiments, the oven 10 includes a programmable electronic controller (not shown) that executes a thermal cycle recipe and/or a flow cycle recipe to perform more complex and/or tightly controlled thermal processing. As previously noted, the thermal processing may include, by way of non-limiting illustrative example, annealing, thermal oxidation, post-exposure bake (PEB) as part of a photolithography process, dopant diffusion, material deposition, various combinations thereof, or so forth.

After the thermal processing is complete, the process is substantially reversed to unload the wafer boats carrying the semiconductor wafers. The robot 40 picks up the wafer magazine jig 26 using its gripping assembly 42 and places it back onto the wafer magazine jig seat of the load port 14, seated opposite from the corresponding seated wafer magazine 20. The second push bar 32 is motorized and includes an engagement surface 33 (labeled only in FIG. 3) that moves toward and into the wafer magazine jig 26 (e.g., to the left in the perspective view of FIG. 3) to engage and push the wafer boats (with thermally processed semiconductor wafers) contained in the wafer magazine jig 26 out of the end of the wafer magazine jig 26 facing the seated wafer magazine 20 of the wafer transfer subassembly, and continues to push the wafer boats until the wafer boats are pushed into the seated wafer magazine 20. The second push bar 30 then retracts. (Note again, FIGS. 1-3 show all push bars in their respective fully retracted positions). Thereafter, the AMHS 21 (see FIG. 1) removes the wafer magazine jig 20 from the load port 14 and, typically, into a carrier or pod of the AMHS 21 for transport to the next processing tool of the integrated circuit (IC) fabrication workflow.

Figure 4:
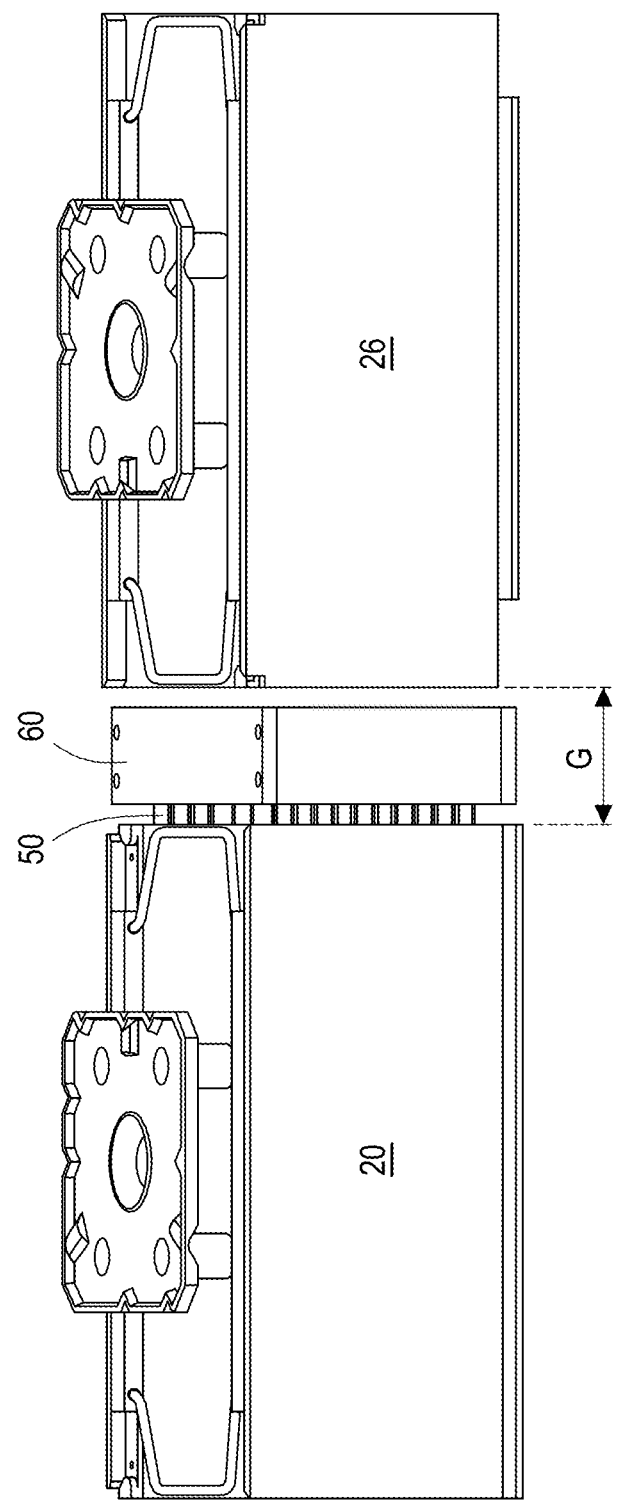
FIG. 4 diagrammatically illustrates a perspective view of a wafer magazine and wafer magazine jig and a boat bridge interposed therebetween, which is suitably employed in conjunction with the load port of FIG. 1 and FIG. 2.

With continuing reference to FIG. 3 and with further reference to FIG. 4 which shows the seated wafer magazine jig 20 and seated wafer magazine jig 26 of a wafer transfer subassembly in isolation, there is a gap G between the seated wafer magazine 20 and the seated wafer magazine jig 26. In some non-limiting illustrative embodiments, the gap G between the wafer magazine 20 and the wafer magazine jig 26 is greater than or equal to 0.1 mm and is less than or equal to 20 mm, although other values are contemplated.

Figure 5:
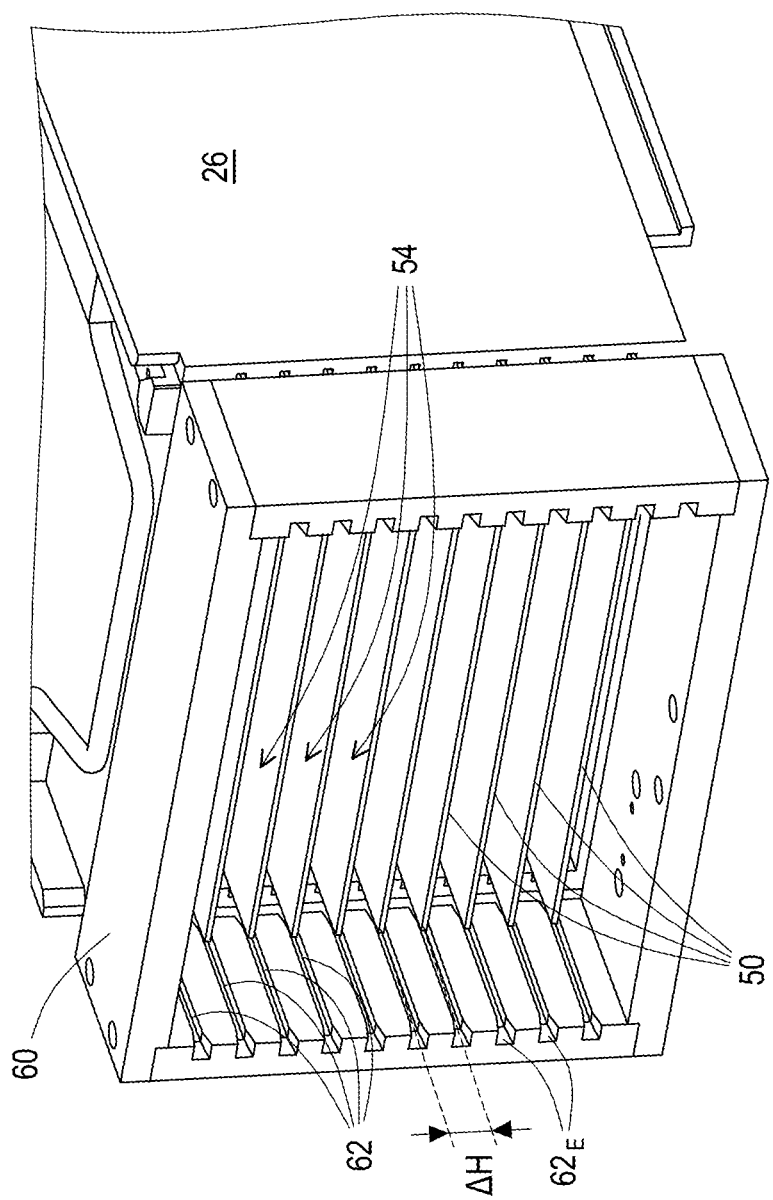
FIG. 5 diagrammatically illustrates a perspective view of the wafer magazine jig and boat bridge of FIG. 3.

FIG. 5 illustrates a portion of a wafer magazine jig 26 proximate to the wafer magazine in their respective seated positions, along with wafer boats 50 being transferred to (or from) the wafer magazine jig 26. FIG. 5 illustrates a batch of ten wafer boats 50; however, as previously noted the number of wafer boats being transferred can be one, two, three, five, ten, more, or substantially any number. As seen in FIG. 5, the wafer boats 50 are generally planar, i.e. having a form factor of a flat plate or the like, and are transferred in horizontal position. Thus, downward gravitational force acts on the wafer boats 50 crossing the gap G. This can lead to the wafer boats sagging due to lack of bottom support as they cross the gap G. Additionally, the semiconductor wafers (not shown) on the wafer boats 50 may have some wafer bowing due to compressive or tensile net strain introduced by material layers deposited onto the wafer. Yet further, differential thermal expansion can introduce warpage of the wafer boats and/or the semiconductor wafers.

Furthermore, to maximize wafer throughput, it is generally desirable to pack as many wafer boats 50 into the wafer magazine 20 (and hence into the wafer magazine jig 26) as possible for a given size of the wafer magazine 20. This leads to a vertical spacing All between neighboring wafer boats 50 (indicated in FIG. 5) being beneficially made as small as feasible.

Figure 6:
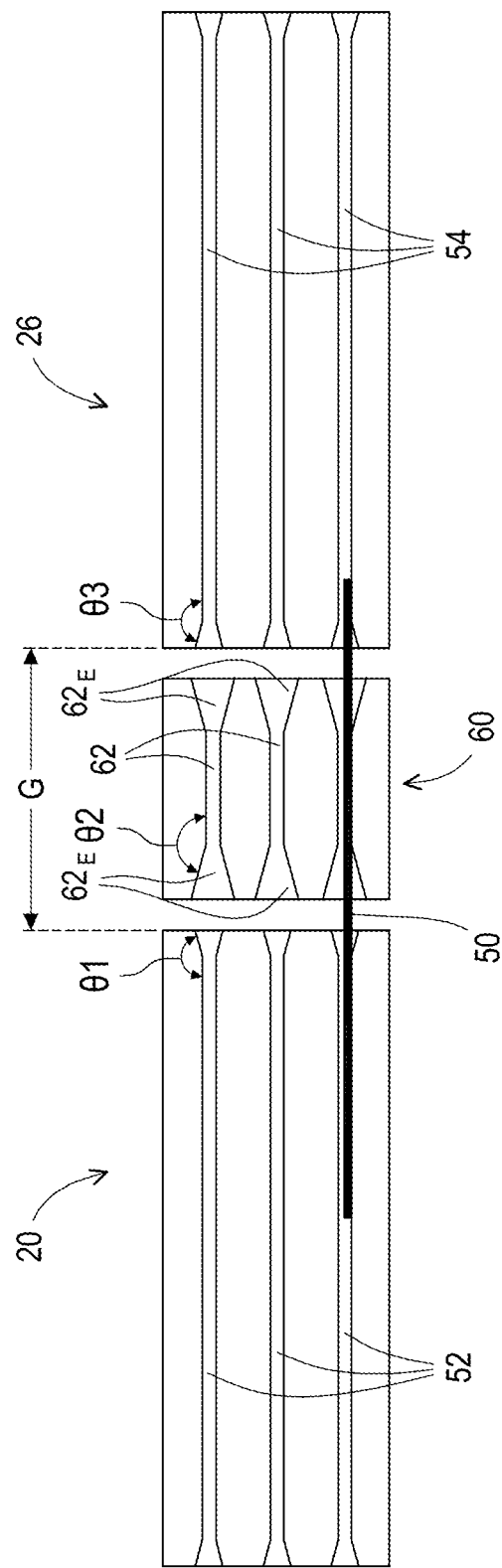
FIG. 6 diagrammatically illustrates a side sectional view of a wafer magazine, a wafer magazine jig, and an interposed boat bridge suitably employed in conjunction with the load port of FIG. 1 and FIG. 2.

FIG. 6 shows a side sectional view of the wafer magazine 20 and wafer magazine jig 26 of a wafer transfer subassembly. As seen in FIG. 6, the wafer magazine 20 has wall slots 52, and likewise the wafer magazine jig 26 has wall slots 54 which are vertically aligned with the wall slots 52 of the facing wafer magazine 20. Note that the side sectional view of FIG. 6 is enlarged and only shows three wall slots 52 and three wall slots 54. With reference back to FIG. 5, the horizontally oriented wafer boats 50 are supported by their edges in the wall slots 54 of the wafer magazine jig 26 when they are in the wafer magazine jig 26. Similarly (though not shown), the wafer boats 50 are supported by their edges in the wall slots 52 of the wafer magazine 20 when they are in the wafer magazine 20. Note, FIG. 6 diagrammatically shows a single wafer boat 50, however as shown in FIG. 5 in general there may be a wafer boat supported by each wall slot 52 of the wafer magazine 20 or each wall slot 54 of the wafer magazine jig 26.

This arrangement in which the wafer boats 50 are supported by their edges engaged into the wall slots 52 when in the wafer magazine 20, or by their edges engaged into the wall slots 54 of the wafer magazine jig 26, has substantial advantages. First, it leaves the bulk of the interior of the wafer magazine 20 open (and likewise for the wafer magazine jig 26) hollow, which allows the vertically extended surfaces 31 and 33 of the respective first and second push bars 30 and 32 (see FIG. 3) to fit into and pass through an open central bore of the wafer magazine 20 and an open central bore of wafer magazine jig 26, while supported by their edges disposed in the respective wall slots 52, 54. While having a central bore, the wafer magazine 20 may optionally have a closed end distal from the end that faces the wafer magazine jig 26. Similarly, while having a central bore, the wafer magazine jig 26 may optionally have a closed end distal from the end that faces the wafer magazine 20.

A second advantage of this arrangement in which the wafer boats 50 are supported by their edges is that, by contacting the wafer boats 50 only by their edges, the potential for contamination of the semiconductor wafers on the wafer boats 50 is reduced. By contrast, if the wafer boats are slid across a larger surface area this can generate airborne particulates that can potentially contaminate the surfaces of the semiconductor wafers disposed on the wafer boats 50.

A third advantage of this arrangement in which the wafer boats 50 are supported by their edges is that this edge-supported arrangement can accommodate thermal expansion of the wafer boats 50 due to heating of the wafer boats 50 in the oven chamber 12, and also presents a limited thermally conductive path for heat transfer.

The gap G (indicated in FIGS. 3, 4, and 6) between the seated wafer magazine 20 and the seated wafer magazine jig 26 of a wafer transfer subassembly beneficially relaxes the tolerance in the precision with which the AMHS 21 and robot 40 place the wafer magazine 20 and wafer magazine jig 26, respectively, on the load port 14. However, the gap G can introduce some problems. The wafer boats 50 and/or the carried semiconductor wafers can warp due to factors such as lattice mismatch-induced stress or strain in a semiconductor wafer with epitaxially mismatched epitaxial layers, differential thermal expansion, can expand when heated, can sag due to gravitational force when being transferred across the gap G, or can experience a combination of such effects. This can result in unreliable transfer of the wafer boats 50 between the wafer magazine 20 and wafer magazine jig 26. A wafer boat exiting a wall slot 52 of the wafer magazine 20 may fail to align with and mate into the corresponding wall slot 54 of the wafer magazine jig 26 during the loading process. Similarly, a wafer boat exiting a wall slot 54 of the wafer magazine jig 26 may fail to align with and mate into the corresponding wall slot 52 of the wafer magazine 20 during the unloading process. A small spacing ΔH between vertically neighboring wafer boats 50 motivated by a desire to maximize the number of wafer boats 50 in the wafer magazine 20, and the edge-wise support of the wafer boats 50 in the wall slots 52 and/or 54, can increase likelihood of unreliable transfer of the wafer boats 50 between the wafer magazine 20 and wafer magazine jig 26.

To address this problem, with reference to FIGS. 1-6 and particular reference to FIGS. 3-6, a boat bridge 60 is interposed between the seated wafer magazine 20 and the seated wafer magazine jig 26. Equivalently, it may be stated that the boat bridge 60 is interposed between the wafer magazine seat 22 and the wafer magazine jig seat. As seen in FIGS. 5 and 6, the boat bridge 60 includes wall slots 62 that, as best seen in FIG. 6, are aligned with the wall slots 52 of the seated wafer magazine 20 and are aligned with the wall slots 54 of the seated wafer magazine jig 26. Hence, as the wafer boats 50 are transferred between the seated wafer magazine 20 and the seated wafer magazine jig 26, they are supported in the gap G by the wall slots 62 of the boat bridge 60. As with the wafer magazine 20 and the wafer magazine jig 26, the boat bridge 60 is hollow, with an open central bore through which the wafer boats pass while supported by their edges in the wall slots 62.

With reference back to FIG. 3, in some embodiments the boat bridge 60 of each wafer transfer subassembly retracts into a recess of the load port 14 of the oven 10 when not in use. FIG. 3 illustrates one boat bridge 60 that is elevated out of the recess, and another boat bridge $60_R$ that is retracted into the recess of the load port 14. In some embodiments, this can be automated as follows. After the AMHS 21 disposes the wafer magazine 20 on the load port 14 (that is, seated into the wafer magazine seat 22) and before the transferring, a motor or pneumatic cylinder or hydraulic cylinder or the like is operated to elevate the boat bridge 60 into its operational position at least partway out of a recess of the load port 14 so that its wall slots 62 are aligned with the wall slots 52, 54 of the respective wafer magazine 20 and wafer magazine jig 26. In one suitable approach, the wafer magazine seat 22 includes a plunger that extends upward, and is depressed by the wafer magazine 20 when it is seated into the wafer magazine seat 22, and the depression of the plunger generates an actuation signal that triggers the elevation of the boat bridge 60. Conversely, when the wafer magazine 20 is removed from the wafer magazine seat 22 the plunger springs back up, thereby providing the actuation signal for lowering the boat bridge 60 back into the recess of the load port 14.

This arrangement in which the boat bridge 60 is stored in a recess of the load port 14 when not in use has certain advantages. It provides a more compact and reduced profile of the load port 14. It also can enable the elevation of the boat bridge 60 to be tuned to precisely align the wall slots 62 of the boat bridge 60 with the wall slots 52, 54 of the respective seated wafer magazine 20 and seated wafer magazine jig 26. This can be done manually, or in a variant embodiment optical sensors can be used—e.g., the boat bridge 60 can be elevated until a laser beam passes through all of the wall slots 52, 54, 62 to hit a photodetector thus indicating alignment.

On the other hand, in some embodiments the boat bridge 60 is not elevated and retracted into a recess of the load port 14. Rather, in these embodiments the boat bridge 60 is stationary and is always at the appropriate height so that the wall slots 62 of the boat bridge 60 are aligned with the wall slots 52, 54 of the respective seated wafer magazine 20 and seated wafer magazine jig 26.

Figure 7:
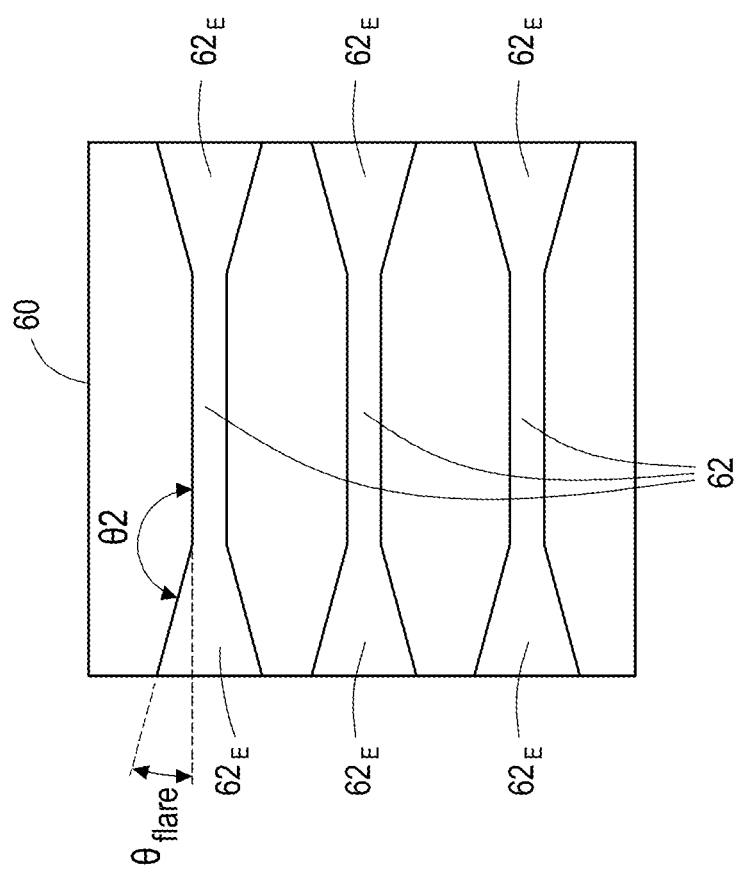
FIG. 7 diagrammatically illustrates a side sectional view of a boat bridge suitably employed in conjunction with the load port of FIG. 1 and FIG. 2.

With reference to FIGS. 5 and 6 and with further reference to FIG. 7, the boat bridge 60 can also optionally also provide guiding of the wafer boats 50, in addition to providing support for the wafer boats 50 as they pass across the gap G. To this purpose, the illustrative wall slots 62 of the boat bridge 60 have outwardly flared ends $62_E$. If a wafer boat 50 approaches entry into the boat bridge 60 with a warp of the wafer boat 50 being sufficient cause it to miss the aligned slot 62 of the boat bridge 60, then the flared end $62_E$ can operate to guide the warped boat bridge into the aligned slot 62 by cam action of the surface of the flared end $62_E$ which urges the edge of the warped wafer boat 50 downward (in the case of the boat being warped upward) or upward (in the case of the boat being warped downward) so as to slide into the aligned slot 62.

In some nonlimiting illustrative embodiments, a flare angle $\theta_{flare}$ of the outwardly flared ends $62_E$ is 60 degrees or less, although a larger flare angle is also contemplated. Larger values of the flare angle can reduce the effectiveness of the camming action, as it approaches presenting a vertical wall to the incoming wafer boat edge. In some nonlimiting illustrative embodiments, a flare angle $\theta_{flare}$ of the outwardly flared ends $62_E$ is at least 15 degrees. Smaller values of the flare angle reduce the vertical extent of the outward flaring, which can result in a warped wafer boat missing entry into the outwardly flared end. As indicated in FIG. 7, the outwardly flared end can equivalently be quantified in terms of an indicated angle $\theta 2$, where $\theta 2=180°-\theta_{flare}$.

FIGS. 6 and 7 illustrate side sectional views showing the wall slots 62 of the boat bridge 60, which illustrate the outwardly flared ends $62_E$ flaring outwardly in the vertical direction. The flare angle $\theta_{flare}$ (or equivalently $\theta 2$) refers to the outward flaring in the vertical direction. The outwardly flared ends $62_E$ may optionally also flare outwardly in the horizontal direction, as seen in the perspective view of FIG. 5. This horizontal flaring can guide the wafer boat 50 into the boat bridge 60 in cases in which the wafer boat 50 is offset laterally from the opening of the boat bridge 60.

With particular reference to FIG. 6, the ends of the wall slots 52 of the wafer magazine 20 and/or the ends of the wall slots 54 of the wafer magazine jig 26 can optionally also have outwardly flared ends. In FIG. 6, the outwardly flared ends of the wall slots 52 of the wafer magazine 20 have angle $\theta 1$, and the outwardly flared ends of the wall slots 54 of the wafer magazine jig 26 have angle $\theta 3$ as indicated in FIG. 6. In one nonlimiting exemplary embodiment, $\theta 1=\theta 3$ and $\theta 1>\theta 2$ and $\theta 3>\theta 2$. In some such embodiments, $\theta 2 \geq 120°$. In some embodiments, the wall slots 52 of the wafer magazine 20 and/or the wall slots 54 of the wafer magazine jig 26 have outwardly flared ends whose flare angle is smaller than the flare angle of the outwardly flared ends of the wall slots of the boat bridge. In some embodiments, the wall slots 52 of the wafer magazine 20 and/or the wall slots 54 of the wafer magazine jig 26 do not have outwardly flared ends. These are merely illustrative examples. Furthermore, although not shown, it is contemplated for the wall slots 52 of the wafer magazine 20 and/or the ends of the wall slots 54 of the wafer magazine jig 26 to optionally also have outwardly flared ends that are outwardly flared in the horizontal direction.

Figure 8:
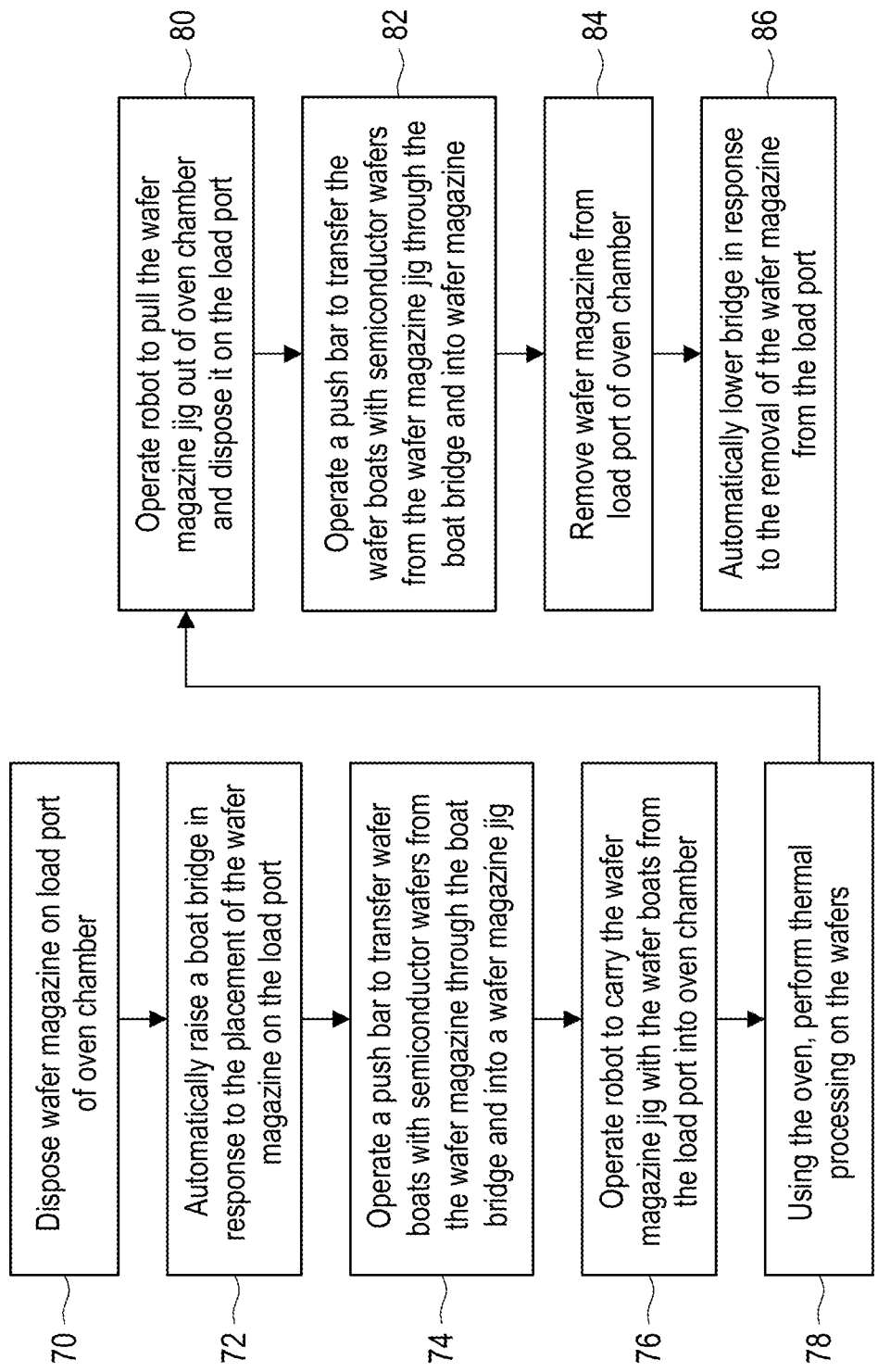
FIG. 8 illustrates a flow chart of a thermal processing method performed using an oven chamber and load port thereof.

With reference to FIG. 8, an illustrative method for transferring wafers to and from an oven chamber 12 using the boat bridge 60 is described. In an operation 70, the wafer magazine 20 is disposed on the load port 14 of the oven chamber 12, i.e. the wafer magazine 20 is seated in the wafer magazine seat 22. For example, this may be done by the AMHS 21 (see FIG. 1). In an operation 72, the recessed boat bridge $60_R$ is raised by a motor, hydraulic cylinder, pneumatic cylinder, or other motive mechanism from its recess in the load port 14 to its elevated position (see FIG. 3 and related discussion). The operation 72 may be triggered, for example, by the placement of the wafer magazine 20 onto the wafer magazine seat 22 depressing a button or otherwise activating an actuator that generates a control signal triggering the motor, cylinder, or the like to elevate the boat bridge 60. In embodiments in which the boat bridge 60 is not raised/recessed, operation 72 is suitably omitted.

In an operation 74, the first push bar 30 is operated to transfer the wafer boats 50 (with semiconductor wafers loaded thereon, typically) from the seated wafer magazine 20 through the boat bridge 60 and into the wafer magazine jig 26. In an operation 76, the multi-axis robot 40 is operated (e.g. is programmed to) carry the wafer magazine jig 26 with the wafer boats from the load port 14 into the oven chamber 12 (see FIGS. 1 and 2 and related discussion). In some embodiments, the entire unit including the wafer magazine jig 26 and the wafer boats 50 therein with loaded semiconductor wafers is placed into the oven chamber 12 by the robot 40. In this case, the wafer magazine jig 26 is suitably made of a material that can withstand the elevated temperature and the ambient in the oven chamber 12 without decomposition or unacceptable outgassing. In other embodiments, the gripping assembly 42 includes a push bar (e.g. similar to the push bars 30, 32) that pushes the wafer boats 50 out of the wafer magazine jig 26 and into the oven chamber 12, for example to be supported by wall slots or a flat surface in the oven chamber 12 (details not shown).

In an operation 78, the oven 10 is used to perform thermal processing on the semiconductor wafers that were loaded into the oven chamber 12 in the operation 76. As previously discussed, the thermal processing may include, by way of non-limiting illustrative example, annealing, thermal oxidation, PEB as part of a photolithography process, dopant diffusion, material deposition, various combinations thereof, or so forth, and may involve preprogrammed temperature ramp-up/dwell/ramp-down, cycling of ambient gas composition and/or ambient pressure, or so forth.

In an operation 80, upon completion of the thermal processing 78 the robot 40 is operated (e.g. pre-programmed) to pull the wafer magazine jig 26 out of the oven chamber 12 and dispose it back onto the wafer magazine jig seat of the load port 14. (In the variant embodiment in which only the wafer boats were inserted into the oven chamber, the operation 80 initially entails using a pull arm or other mechanism integrated into the gripping assembly 42 to retrieve the wafer boats back into the wafer magazine jig). In an operation 82, the second push bar 32 is operated to transfer the wafer boats 50 with the (now thermally processed) semiconductor wafers loaded thereon out of seated wafer magazine jig 26, through the boat bridge 60, and back into the seated wafer magazine 20. In an operation 84, the wafer magazine 20 is removed from the load port 14, e.g. again by the AMHS 21.

If the operation 72 was performed to raise the boat bridge 60 out of the recess in the load port 14, then in an operation 86 the boat bridge 60 is retracted back into the recess of the load port 14 by operation of the motor, hydraulic cylinder, pneumatic cylinder, or other motive mechanism. The operation 86 may be triggered, for example, by the removal of the wafer magazine 20 from the wafer magazine seat 22 releasing the button or other actuator that triggered the operation 72. In embodiments in which the operation 72 is omitted it follows that the operation 86 is also omitted.

In the following, some further embodiments are described.

In a nonlimiting illustrative embodiment, a wafer transfer method is disclosed for transferring wafers to an oven chamber. A wafer magazine is disposed on a load port of the oven chamber. The wafer magazine contains one or more wafer boats with semiconductor wafers. The wafer boats are supported in the wafer magazine by wall slots of the wafer magazine. Using a push bar, the one or more wafer boats are transferred out of the wafer magazine and into a wafer magazine jig disposed on the load port. The transferred one or more wafer boats are supported in the wafer magazine jig by wall slots of the wafer magazine jig. The transferring includes supporting the one or more wafer boats as the one or more wafer boats pass across a gap between the wafer magazine and the wafer magazine jig by wall slots of a boat bridge that is interposed between the wafer magazine and the wafer magazine jig. After the transfer and using a robot, the one or more wafer boats in the wafer magazine jig are moved into the oven chamber.

In a nonlimiting illustrative embodiment, a wafer loading system is disclosed for loading wafer boats stored in an associated wafer magazine to an associated oven chamber. The wafer loading system includes a wafer magazine jig, a load port, a bidirectional push bar, and a boat bridge. The load port has a wafer magazine seat configured to seat the associated wafer magazine and a wafer magazine jig seat configured to seat the wafer magazine jig. The bidirectional push bar is arranged to push wafer boats between the associated wafer magazine seated in the wafer magazine seat and the wafer magazine jig seated in the wafer magazine jig seat. The boat bridge is disposed in a gap between the wafer magazine seat and the wafer magazine jig seat, and is configured to support wafer boats being pushed between the associated wafer magazine seated in the wafer magazine seat and the wafer magazine jig seated in the wafer magazine jig seat.

In a nonlimiting illustrative embodiment, a wafer transfer method is disclosed for transferring wafers to an oven chamber. The method includes: disposing a wafer magazine on a load port of the oven chamber, the wafer magazine containing wafer boats with semiconductor wafers; pushing the wafer boats out of the wafer magazine and into a wafer magazine jig disposed on the load port; during the pushing, supporting the wafer boats as the wafer boats pass across a gap between the wafer magazine and the wafer magazine jig using a boat bridge; and moving the wafer boats in the wafer magazine jig into the oven chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer transfer method for transferring wafers to an oven chamber, the method comprising:
    disposing a wafer magazine on a load port of the oven chamber, the wafer magazine containing one or more wafer boats with semiconductor wafers wherein the wafer boats are supported in the wafer magazine by wall slots of the wafer magazine;
    using a push bar, transferring the one or more wafer boats out of the wafer magazine and into a wafer magazine jig disposed on the load port wherein the transferred one or more wafer boats are supported in the wafer magazine jig by wall slots of the wafer magazine jig;
    during the transferring, supporting the one or more wafer boats as the one or more wafer boats pass across a gap between the wafer magazine and the wafer magazine jig by wall slots of a boat bridge that is interposed between the wafer magazine and the wafer magazine jig; and
    after the transferring and using a robot, moving the one or more wafer boats in the wafer magazine jig into the oven chamber.

2. The method of claim 1 further comprising:
    after the disposing of the wafer magazine on the load port of the oven chamber and before the transferring, operating a motor or pneumatic cylinder or hydraulic cylinder to elevate the boat bridge at least partway out of a recess of the load port.

3. The method of claim 2 further comprising:
    using a second push bar, second transferring the one or more wafer boats out of the wafer magazine jig and into the wafer magazine wherein the transferred one or more wafer boats are supported in the wafer magazine by wall slots of the wafer magazine;
    during the second transferring, supporting the one or more wafer boats as the one or more wafer boats pass across the gap between the wafer magazine and the wafer magazine jig by wall slots of the boat bridge that is interposed between the wafer magazine and the wafer magazine jig; and
    removing the wafer magazine from load port of the oven chamber.

4. The method of claim 1 wherein:
    the wall slots of the wafer magazine are vertically aligned with corresponding wall slots of the wafer magazine jig, and
    the wall slots of the wafer magazine are vertically aligned with corresponding wall slots of the boat bridge.

5. The method of claim 1 wherein the wall slots of the boat bridge have outwardly flared ends.

6. The method of claim 5 wherein the outwardly flared ends have a flare angle of 60 degrees or less.

7. The method of claim 5 wherein the wall slots of the wafer magazine and the wall slots of the wafer magazine jig do not have outwardly flared ends or have outwardly flared ends whose flare angle is smaller than the flare angle of the outwardly flared ends of the wall slots of the boat bridge.

8. The method of claim 1 wherein the gap between the wafer magazine and the wafer magazine jig is greater than or equal to 0.1 mm and is less than or equal to 20 mm.

9. A wafer loading system for loading wafer boats stored in an associated wafer magazine to an associated oven chamber, the wafer loading system comprising:
    a wafer magazine jig;
    a load port having a wafer magazine seat configured to seat the associated wafer magazine and a wafer magazine jig seat configured to seat the wafer magazine jig;
    a bidirectional push bar arranged to push wafer boats between the associated wafer magazine seated in the wafer magazine seat and the wafer magazine jig seated in the wafer magazine jig seat; and
    a boat bridge disposed in a gap between the wafer magazine seat and the wafer magazine jig seat and configured to support wafer boats being pushed between the associated wafer magazine seated in the wafer magazine seat and the wafer magazine jig seated in the wafer magazine jig seat, wherein the boat bridge has wall slots for supporting wafer boats being pushed between the associated wafer magazine seated in the wafer magazine seat and the wafer magazine jig seated in the wafer magazine jig seat.

10. The wafer loading system of claim 9 wherein:
    the associated wafer magazine has wall slots for supporting wafer boats stored in the associated wafer magazine; and
    the wafer magazine jig has wall slots for supporting wafer boats in the wafer magazine jig.

11. The wafer loading system of claim 10 wherein the wall slots of the associated wafer magazine seated in the wafer magazine seat and the wall slots of the wafer magazine jig seated in the wafer magazine jig seat are mutually aligned.

12. The wafer loading system of claim 11 further comprising:
a motor or pneumatic cylinder or hydraulic cylinder operatively connected to elevate the boat bridge from a recess of the load port to a position at which the wall slots of the boat bridge are mutually aligned with the wall slots of the associated wafer magazine seated in the wafer magazine seat and the wall slots of the wafer magazine jig seated in the wafer magazine jig seat.

13. The wafer loading system of claim 10 wherein the wall slots of the boat bridge have outwardly flared ends.

14. The wafer loading system of claim 13 wherein the outwardly flared ends have a flare angle of 60 degrees or less.

15. The wafer loading system of claim 9 wherein;
the associated wafer magazine has wall slots for supporting wafer boats stored in the associated wafer magazine;
the wafer magazine jig has wall slots for supporting wafer boats in the wafer magazine jig;
the wall slots of the boat bridge have outwardly flared ends; and
the wall slots of the wafer magazine and the wall slots of the wafer magazine jig do not have outwardly flared ends or have outwardly flared ends whose flare angle is smaller than the flare angle of the outwardly flared ends of the wall slots of the boat bridge.

16. The wafer loading system of claim 9 further comprising:
a multi-axis robot configured to unseat the wafer magazine jig from the wafer magazine jig seat of the load port and to transfer wafer boats in the wafer magazine jig to the associated oven chamber.

17. The wafer loading system of claim 9 further comprising:
a multi-axis robot configured to transfer the wafer magazine jig from the wafer magazine jig seat of the load port into the associated oven chamber.

18. A wafer transfer method for transferring wafers to an oven chamber, the method comprising:
disposing a wafer magazine on a load port of the oven chamber, the wafer magazine containing wafer boats with semiconductor wafers;
pushing the wafer boats out of the wafer magazine and into a wafer magazine jig disposed on the load port;
during the pushing, supporting the wafer boats as the wafer boats pass across a gap between the wafer magazine and the wafer magazine jig using a boat bridge, the supporting including guiding the wafer boats passing through the boat bridge using wall slots of the boat bridge; and
moving the wafer boats in the wafer magazine jig into the oven chamber.

19. The wafer transfer method of claim 18 further comprising:
before pushing the wafer boats out of the wafer magazine and into the wafer magazine jig, raising the boat bridge from a recessed position in which the boat bridge is recessed into the load port to an elevated position in which the boat bridge provides the supporting.

20. The wafer transfer method of claim 18 further comprising:
guiding entry of the wafer boats into the boat bridge using outwardly flared ends of the wall slots of the boat bridge.

* * * * *